(12) United States Patent
Carneiro et al.

(10) Patent No.: US 9,553,527 B1
(45) Date of Patent: Jan. 24, 2017

(54) ENERGY RECOVERY LAYER IN AN ELECTROWETTING DISPLAY

(71) Applicant: Amazon Technologies, Inc., Seattle, WA (US)

(72) Inventors: Steven Ramos Carneiro, Eindhoven (NL); Pavel Novoselov, Eindhoven (NL); Suki Sandhu, Eindhoven (NL)

(73) Assignee: Amazon Technologies, Inc., Seattle, WA (US)

(*) Notice: Subject to any disclaimer, the term of this patent is extended or adjusted under 35 U.S.C. 154(b) by 0 days.

(21) Appl. No.: 14/557,241

(22) Filed: Dec. 1, 2014

(51) Int. Cl.
　　*G02B 26/00*　　(2006.01)
　　*G02B 26/02*　　(2006.01)
　　*H02N 11/00*　　(2006.01)

(52) U.S. Cl.
　　CPC ............ *H02N 11/002* (2013.01); *G02B 26/005* (2013.01)

(58) Field of Classification Search
　　CPC .............................. G02B 26/004; G09G 3/348
　　USPC ...................... 359/226.3, 228, 290–292, 665
　　See application file for complete search history.

(56) References Cited

U.S. PATENT DOCUMENTS

| | | | | |
|---|---|---|---|---|
| 4,974,945 A | * | 12/1990 | Kumada | G02F 1/0555 250/250 |
| 5,306,912 A | * | 4/1994 | Sibbald | H01L 37/02 250/334 |
| 2005/0116812 A1 | * | 6/2005 | Schmidt | G01S 13/751 340/10.1 |
| 2011/0182321 A1 | * | 7/2011 | Yoshizaki | G01J 5/22 374/121 |

* cited by examiner

*Primary Examiner* — Tuyen Tra
(74) *Attorney, Agent, or Firm* — Lee & Hayes, PLLC

(57) ABSTRACT

Subject matter disclosed herein relates to arrangements and techniques that provide for harvesting thermal energy within a display, for example an electrowetting display, of an image display apparatus and converting the thermal energy into electricity. The electrowetting display comprises a first substrate and a second substrate opposite to the first substrate, a plurality of pixel portions defined between the first substrate and the second substrate, and a hydrophobic surface on the first substrate. A first fluid is included within the pixel portions and on the hydrophobic surface, while a second fluid is included on the first fluid, wherein the second fluid is substantially immiscible with the first fluid. A pyroelectric layer is included between the first substrate and the second substrate, wherein the pyroelectric layer is configured to absorb thermal energy within the electrowetting display and output a voltage based upon the thermal energy.

20 Claims, 9 Drawing Sheets

ENERGY RECOVERY LAYER IN AN ELECTROWETTING DISPLAY

BACKGROUND

Most portable electronic devices include displays for displaying various types of images. Examples of such displays include electrowetting displays (EWDs), liquid crystal displays (LCDs), electrophoretic displays (EPDs), light emitting diode displays (LED displays), etc. Many components of portable electronic devices require a substantial amount of power to operate. For example, an EWD generally requires 20 to 40 milliwatts (mW) of power to operate. Additionally, many portable electronic devices, including their displays, generate a fair amount of heat. Such heat, including heat from a surrounding environment of a portable electronic device, may be useful in optimizing the efficiency of the portable electronic device.

BRIEF DESCRIPTION OF THE DRAWINGS

The detailed description is described with reference to non-limiting and non-exhaustive embodiments illustrated in the accompanying figures. The same reference numerals in different figures refer to similar or identical items.

DETAILED DESCRIPTION

Figure 1A:
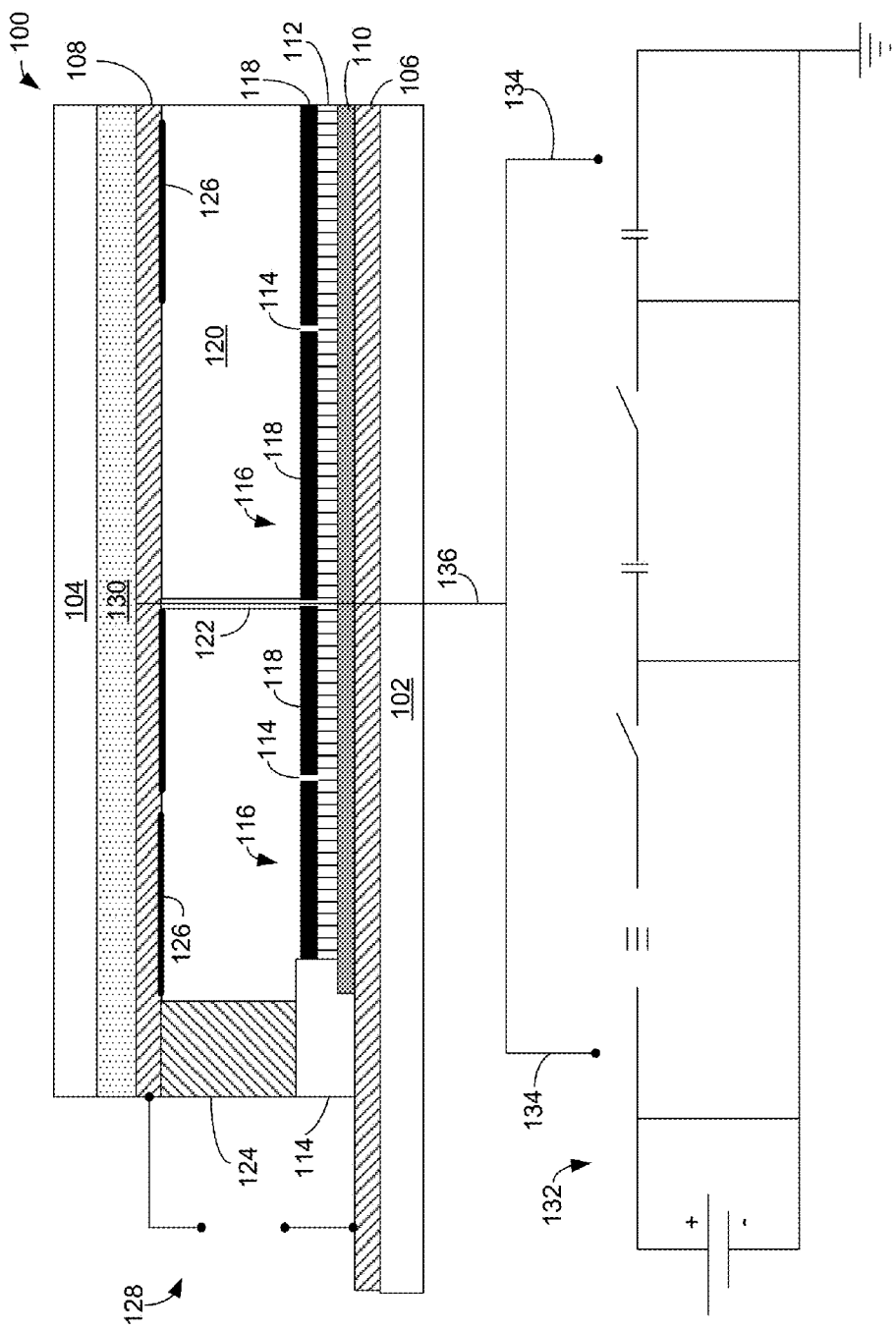
FIGS. 1A-1C are schematic views of examples of electrowetting displays that include one or more pyroelectric layers for harvesting heat to generate electricity, according to various embodiments.

The present disclosure provides arrangements and techniques that provide for harvesting heat generated by an image display apparatus and/or a display of the image display apparatus, for example an EWD, and using the heat to generate power for operation of the image display apparatus and/or a display of the image display apparatus. For example, the power generated may be used to charge a rechargeable power source such as a battery.

In general, image display apparatuses, such as, for example, various portable electronic devices, including, but not limited to, portable computing devices, tablet computers, laptop computers, notebook computers, mobile phones, personal digital assistants (PDAs), and portable media devices (e.g., e-book devices, DVD players, etc.), display images on a display. Examples of such displays include, but are not limited to, LCDs, EWDs and EPDs.

More particularly, a display, such as an electrowetting display, for example, can be a thin film transistor electrowetting display (TFT-EWD) that generally includes an array of transmissive, reflective and/or transflective pixels or sub-pixels (referred to herein as sub-pixels) configured to be operated by an active matrix addressing scheme. For example, rows and columns of sub-pixels are operated by controlling voltage levels on a plurality of source lines and gate lines. In this fashion, the display can produce an image by selecting particular sub-pixels to transmit, reflect or block light. Sub-pixels are addressed (e.g., selected) via rows and columns of the source lines and gate lines that are connected to transistors (e.g., used as switches) included in each sub-pixel. Transistors take up a relatively small fraction of the area of each sub-pixel. For example, the transistor can be located underneath the reflector in reflective displays.

Electrically, each sub-pixel is a small capacitor with a layer of insulating optical material (e.g., liquid crystal material or electrowetting material) sandwiched between two substrates, wherein each substrate generally includes a transparent conductive indium tin oxide (ITO) layer. A one-way current-passing characteristic of the transistor of the sub-pixel prevents charge that is being applied to the sub-pixel from draining between refresh cycles of the display's image.

An electrowetting display employs an applied voltage to change the surface tension of a fluid in relation to a surface. For instance, by applying a voltage to a hydrophobic surface via a pixel electrode in conjunction with a common electrode, the wetting properties of the surface can be modified so that a second fluid has a greater affinity for the surface. Hydrophobic generally refers to repelling polar fluids while hydrophilic generally refers to having an affinity for polar fluids. As one example of an electrowetting display, the modification of the surface energy by applying a voltage causes the electrolyte, considered to be the second fluid, in an electrowetting fluid in individual sub-pixels of the display to adhere to the modified surface and thus, replace an electrowetting oil layer in individual sub-pixels of the display. In accordance with various embodiments, the electrowetting oil may be colored. In accordance with other embodiments, color filters may be included with each sub-pixel. The electrowetting oil layer is generally made up of an oil that is electrically non-conductive and may for instance be an alkane like hexadecane or silicone oil. Thus, the electrowetting fluids in the individual sub-pixels of the display responding to the change in surface tension act as an optical switch.

When the voltage is absent, the electrowetting oil forms a continuous film within a sub-pixel, and a color may thus be visible to a user of the display, either via the electrowetting oil being colored or via a color filter. Additionally, the sub-pixels may provide a black pixel (for either a black and white display or a color display) through the combination of colors of sub-pixels. On the other hand, when the voltage is applied to the sub-pixel, the electrowetting oil is displaced and the sub-pixel becomes transparent, thus providing a light or white sub-pixel, or a light or white pixel (for either a black and white display or a color display) through the combination of sub-pixels. When multiple sub-pixels of the display are independently activated, the display can present a color or grayscale image. The sub-pixels may form the basis for a transmissive, reflective, or transmissive/reflective (transreflective) display. Further, the sub-pixels may be responsive to high switching speeds (e.g., on the order of several milliseconds), while employing small sub-pixel dimensions. Accordingly, the electrowetting displays herein may be suitable for applications such as displaying video and/or static content. In addition, the low power consumption of electrowetting displays in general makes the technology suitable for displaying content on portable displays that rely on battery power.

In accordance with various embodiments, the electrowetting display includes one or more pyroelectric layers that serve as energy recovery layers. The one or more pyroelectric layers harvest heat or thermal energy from within the electrowetting display and convert the harvested heat to electricity, i.e. a voltage. The electricity is then provided to a charge pump circuit, which in turn provides the electricity to a rechargeable power source, such as, for example, a battery. While the use of the pyroelectric layers and the charge pump circuit will generally be described with respect to an electrowetting display, the pyroelectric layers and the charge pump circuit can be utilized with other types of devices, such as other types of displays, where heat can be harvested and converted to a voltage to be provided to some type of power source, such as a battery, in order to provide power to the power source.

FIG. 1A schematically illustrates a cross-sectional view of a portion of an electrowetting display (EWD) 100. The EWD 100 generally includes a first substrate 102 and a second substrate 104. In general, the substrates 102, 104 may be glass, but other materials may be used. The EWD 100 further includes a first electrode 106, often referred to as a pixel electrode, and a second electrode 108, often referred to as a common electrode. A barrier or insulating layer 110 is provided on the electrode 106. The barrier layer 110 includes a hydrophobic coating 112. Pixel walls 114 are provided to divide the EWD 100 into pixels or subpixels 116.

A non-conductive or non-polar fluid, such as an electrowetting oil 118 that may be black or some other color, is provided on the hydrophobic coating 112. A conductive or polar fluid 120 that generally includes an electrolyte is provided over the electrowetting oil 118. The electrowetting oil 118 and the conductive fluid 120 are immiscible with each other.

A spacer 122 can be included between a top portion and a bottom portion of the EWD 100 to thereby provide extra support within the EWD 100. A seal 124 is provided at the ends of the EWD 100 to help seal the display and maintain the electrowetting oil 118 and the conductive fluid 120 within the EWD 100. Only one seal 124 is illustrated in FIG. 1A for clarity. A color filter 126 is generally included so that the EWD 100 can produce various forms of color. The color filter 126 may be an RGBW filter or an RGB filter depending upon the application. A voltage source 128 is provided to provide power to the electrodes 106, 108 for operation of the EWD 100 to thereby generate an electric field between the electrodes 106, 108.

In accordance with the various embodiments, a pyroelectric layer 130 is provided. In the embodiment of FIG. 1A, the pyroelectric layer 130 is included within a top portion of the EWD 100 and therefore is adjacent to the second substrate 104. The pyroelectric layer 130 is coupled to a universal charge pump circuit 132. The pyroelectric layer 130 can be coupled to the charge pump circuit 132 via external connections or jumpers 134, such as, for example, a wirebond connection, or through silicon vias (TSV) 136 coupled to external connections.

During operation of the EWD 100, heat maybe generated. Additionally, a portable electronic device (not shown) that includes the EWD 100 may further generate heat that may permeate into the EWD 100. The pyroelectric layer 130 absorbs some of the heat and converts the heat to an electrical voltage that is provided to the charge pump circuit 132. The charge pump circuit is generally a DC to DC power converter that takes the electrical voltage provided by the pyroelectric layer 130 and uses the voltage to charge a battery (not illustrated) of the portable electronic device that includes the EWD 100. Generally, the charge pump circuit 132 is underneath the EWD 100 and generally integrated into a printed circuit board (PCB) that generally serves as a power management module for the portable electronic device. The charge pump circuit 132 may also be included in the electronics of the EWD 100 or a main logic board of the portable electronic device that includes the EWD 100. In accordance with various embodiments, the pyroelectric layer 130 is polyvinylidene difluoride (PVDF). Other materials may be used in other embodiments.

Figure 1B:
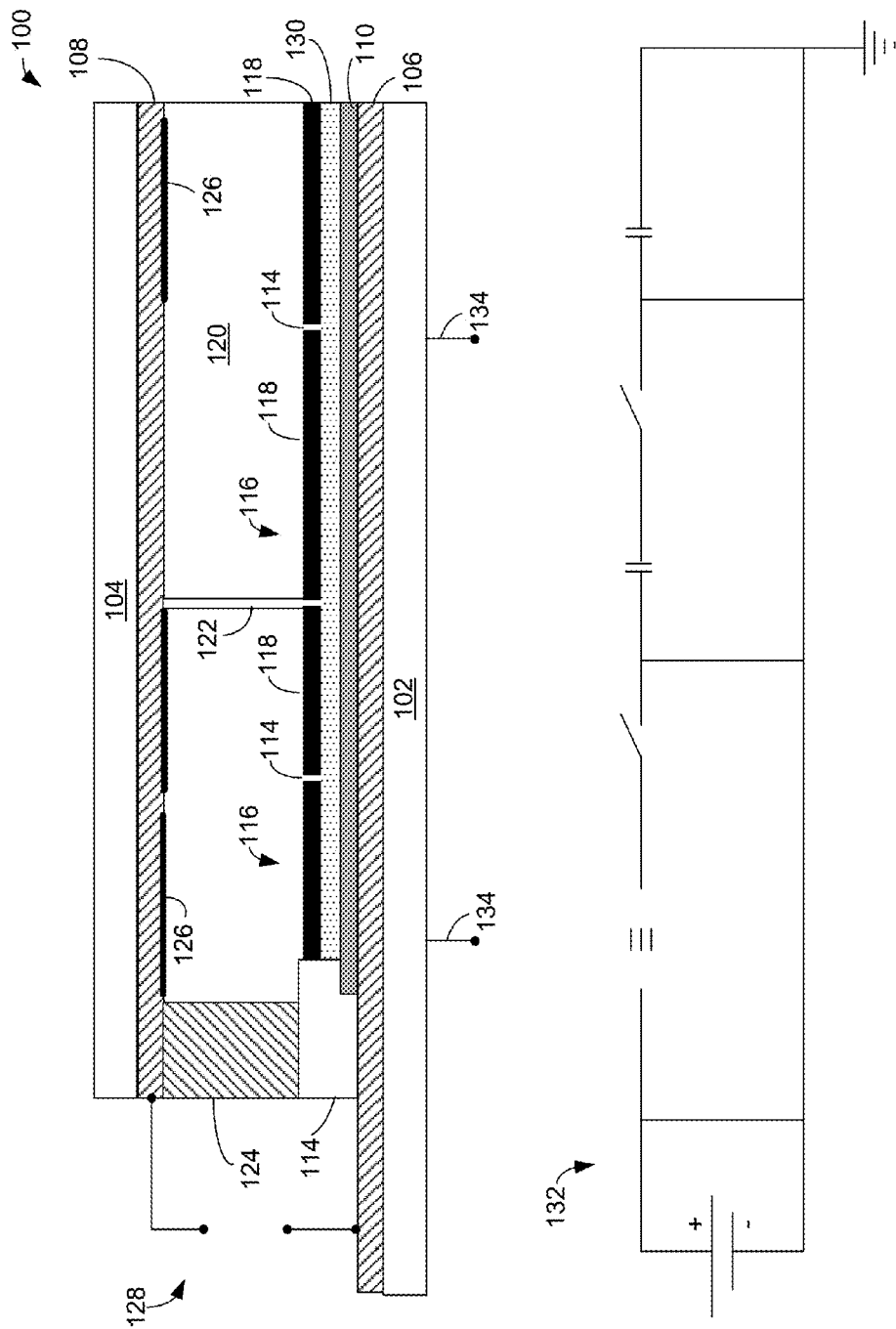

FIG. 1B illustrates another embodiment of the EWD 100. In the embodiment of FIG. 1B, the pyroelectric layer 130 is located in a bottom portion of the EWD 100. In other words, the pyroelectric layer 130 is close to the first substrate 102. In the embodiment of FIG. 1B, the pyroelectric layer 130 is located on the barrier layer 110. As previously noted, in accordance with the various embodiments, the pyroelectric layer 130 is PVDF. This material is generally hydrophobic. Thus, in the embodiment of FIG. 1B, there is no hydrophobic coating 112 as the hydrophobic coating 112 has been replaced by the pyroelectric layer 130, which has hydrophobic properties. The pyroelectric layer 130 is generally coupled to the charge pump circuit 132 via external connections or jumpers 134. For example, the pyroelectric layer 130 is coupled to the charge pump circuit 132 via wirebond connections. The pyroelectric layer 130 may also be coupled to the charge pump circuit 132 via TSVs (not illustrated in FIG. 1B).

Figure 1C:
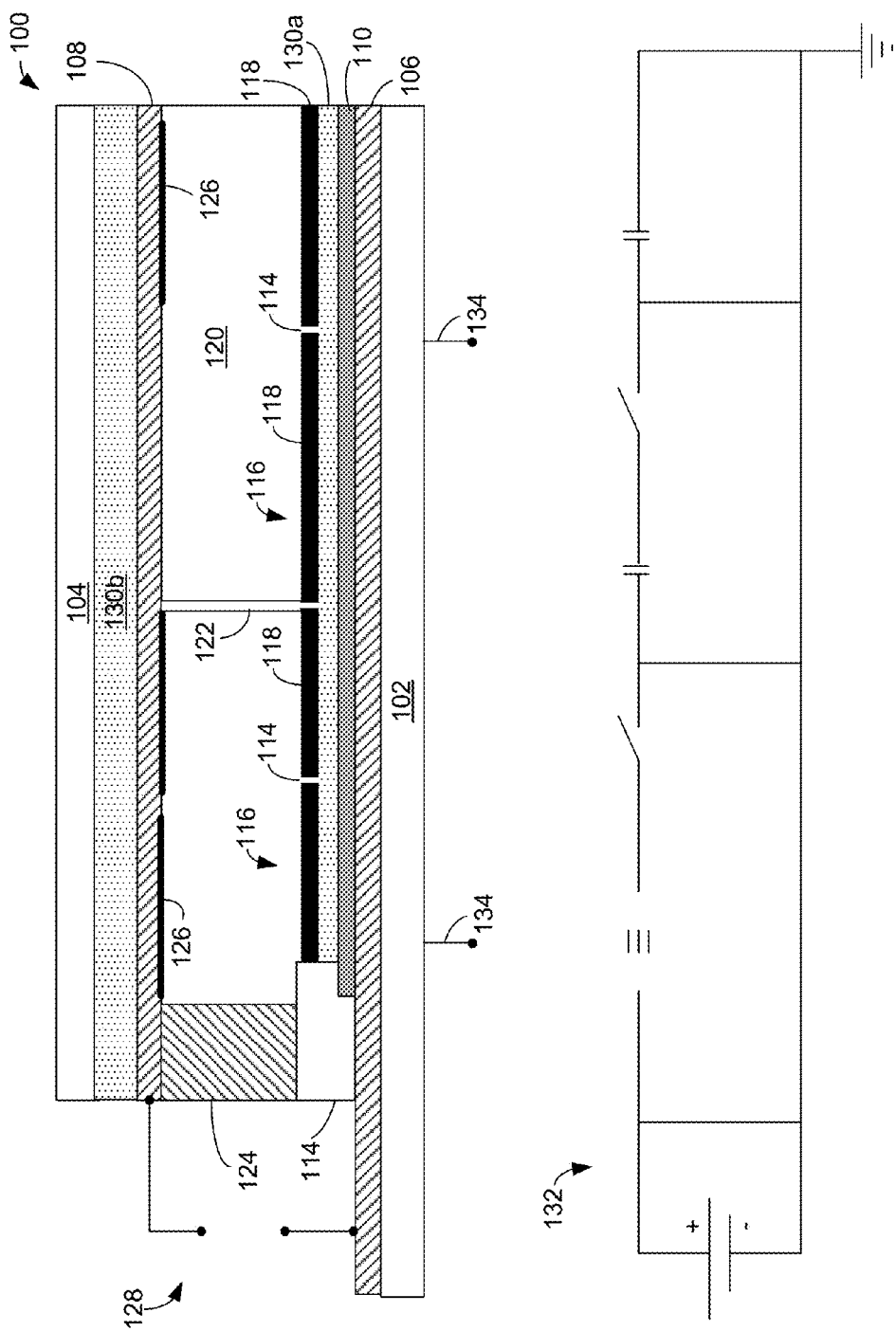

FIG. 1C illustrates another embodiment of the EWD 100. In the embodiment of FIG. 1C, two pyroelectric layers 130a, 130b are included. The first pyroelectric layer 130a is included in a bottom portion of the EWD 100, while the second pyroelectric layer 130b is included in a top portion of the EWD 100. The pyroelectric layers 130a, 130b are generally coupled to the charge pump circuit 132 via external connections or jumpers 134 such as, for example, wire bond connections. One or both of the pyroelectric layers 130a, 130b may also be coupled to the charge pump circuit 132 via TSVs (not illustrated in FIG. 1C).

By utilizing one or more pyroelectric layers 130 within the EWD 100, thermal energy or heat may be harvested from within the EWD 100 and converted by the pyroelectric layers 130 to electricity in the form of voltage. The voltage is then provided to the charge pump circuit 132, which in turn provides the voltage to a rechargeable power source, such as, for example, a battery (not illustrated). While the use of the pyroelectric layers 130 and the charge pump circuit 132 has generally been described with respect to the EWD 100, the pyroelectric layers 130 and the charge pump circuit 132 can be utilized with other types of devices, such as other types of displays, where heat can be harvested and converted to a voltage to be provided to some type of power source, such as a battery, in order to provide power to the power source.

Figure 2:
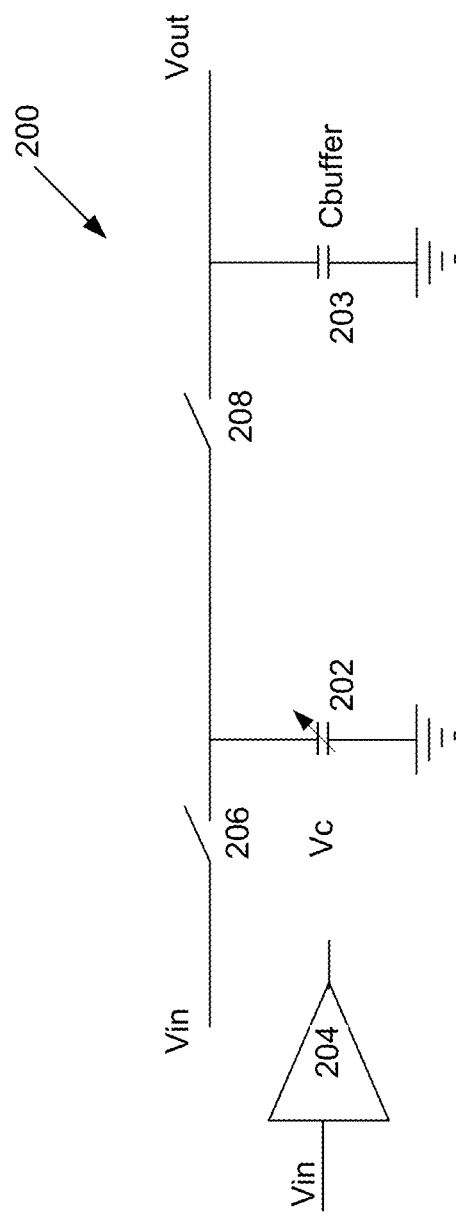
FIG. 2 is a schematic view of an embodiment of a universal charge pump circuit, according to various embodiments.

FIG. 2 illustrates an example of a universal charge pump circuit 200. The charge pump circuit 200 includes a variable capacitor 202 that is controlled by a driver 204 that provides a control or driving voltage $V_c$ to regulate the variable capacitor 202 and thereby control the gain of the charge pump circuit 200. A switch 206 is provided and when the switch 206 is closed, voltage from a pyroelectric layer 130 is provided at $V_{in}$ and charges the variable capacitor 202. When the switch 206 is opened and a second switch 208 is closed, the variable capacitor 202 begins to discharge and charges a buffer capacitor 208. The buffer capacitor 208 provides the voltage at the output $V_{out}$ of the charge pump circuit 200 to a rechargeable power source such as a battery (not illustrated).

Figure 3:
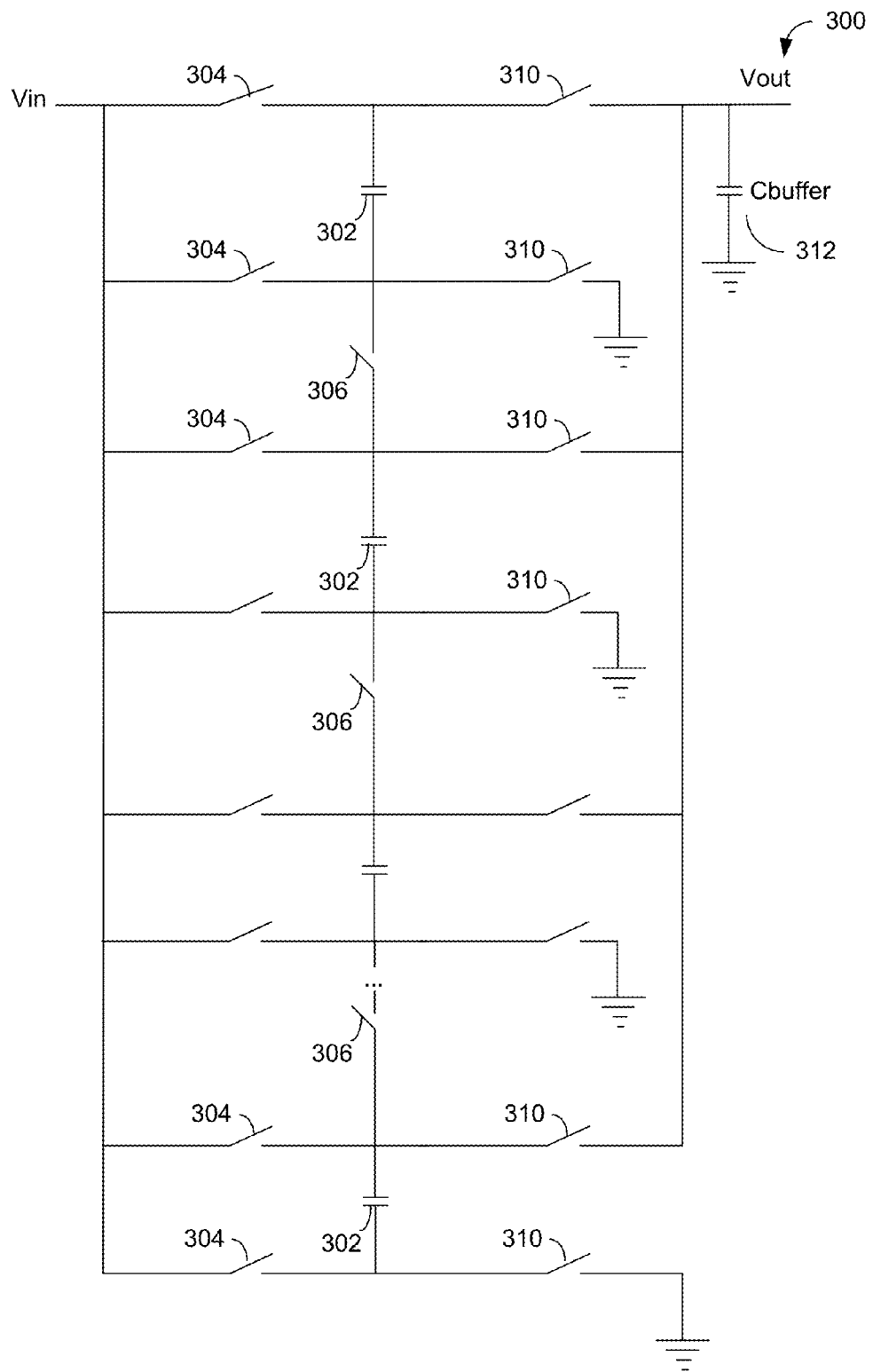
FIG. 3 is a schematic view of another embodiment of a universal charge pump circuit, according to various embodiments.

FIG. 3 illustrates another example of a charge pump circuit 300. The charge pump circuit 300 includes a plurality of capacitors 302 arranged in series. A plurality of first switches 304 and a plurality of second switches 306 are provided. When voltage is provided from a pyroelectric layer 130 at the input $V_{in}$ of the charge pump circuit 300, the first switches 304 and the second switches 306 can be utilized to connect a desired number of capacitors 302 in order to charge the capacitors 302 with voltage from the pyroelectric layer 130. When the first switches 304 are opened and corresponding third switches 310 are closed, the selected capacitors 302 that have been charged begin to discharge and provide the voltage at the output $V_{out}$ of the charge pump circuit 300. A buffer capacitor 312 once again is provided to control the voltage at $V_{out}$. Thus, the gain of the charge pump circuit 300 is dependent upon the number of capacitors 302 that are charged with the voltage $V_{in}$ from the pyroelectric layer 130.

Figure 4:
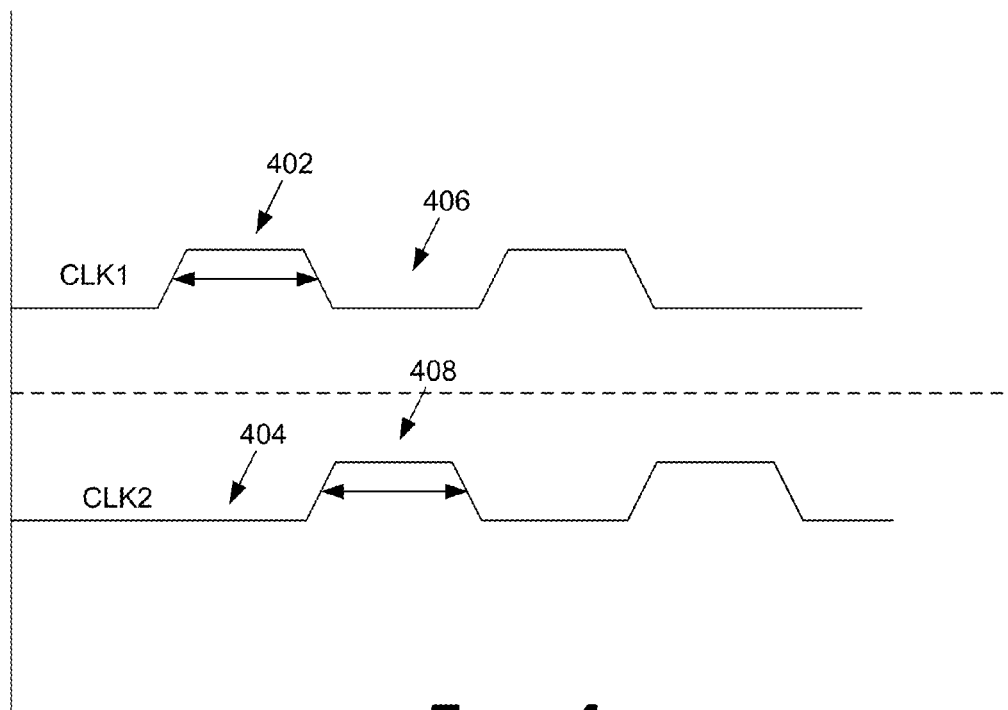
FIG. 4 is a timing diagram for operation of the universal charge pumps of FIGS. 2 and 3, according to various embodiments.

More particularly, the charge pump circuit 300 operates in two cycles: a charging cycle and a discharging cycle. In the charging cycle, the first switches 304 are connected and the third switches 310 are disconnected, closing the circuit and charging the capacitors 302 ($C_{cap1}$–$C_{capn}$). The second switches 306 can be utilized to connect a desired number of capacitors 302 for charging. In the discharging cycle, the third switches 310 are connected and the first switches 304 are disconnected, thereby discharging the capacitors 302 connected by the second switches 306 and charging the capacitor 312 ($C_{buffer}$), which then discharges to the battery (not illustrated). These operations can be represented by two clock signals, clk1 and clk2, respectively, and illustrated in FIG. 4. Generally, both clock signals clk1 and clk2 have the same frequency and period, but are out of phase, which is related the charging/discharging cycles, i.e. when the switches 304 and 310 are connected/disconnected. As can be seen in FIG. 4, clock cycle clk1 (charging cycle) goes high at 402 and clock cycle clk2 (discharging cycle) is simultaneously low at 404. At 406, when clock cycle clk1 (charging cycle) goes low, clock cycle clk2 (discharging cycle) goes high at 408.

As a specific example, assume a configuration of the charge pump circuit 300 that uses 10 capacitors 302 ($C_{cap1}$–$C_{cap10}$), each with a capacitance of 100 nanoFarads (nF), an input voltage ($V_{in}$) of 0.4 V being provided by one or more pyroelectric layers 130 (by converting heat into electricity) and connected to a device of 20 mW (e.g. EWD 100), then equation 1 (where N represents gain) provides as follows:

$$V_{out} = N \cdot V_{in} = 10 \cdot V_{in} \quad (1)$$

The load current ($I_{load}$) is given by equation (2) as follows:

$$I_{load} = 20/4 = 5 \text{ milliamperes (mA)} \quad (2)$$

Assuming a low resistance ($\approx 1$ ohm ($\Omega$)), equation 3 provides:

$$Z_{out} = \sqrt{R_{active}^2 + \left(\frac{1}{C_{total}\omega}\right)^2} \quad (3)$$

The resulting frequency ($\omega$) is generally in the megahertz range and $C_{total}$ is the total capacitance. More particularly, in this example, assuming that all capacitors are identical in this example (for the operating frequency ranges $\omega$)), $Z_{out}$ is the product of $\Delta V = 0.1$ V and $I_{load}$, so $Z_{out}$ is $0.1/(5 \times 10^{-3}) = 20\Omega$. The resulting frequency ($\omega$) is around 0.5 MHz, but the frequencies can generally be manipulated in order to increase the efficiency since the efficiency of the charge pump circuit 300 is dependent on the frequency in use by the capacitors 302.

The universal charge pump circuit 200 of FIG. 2 with a voltage controlled variable has a similar performance, but the gain (N) is a function of the control voltage $V_c$, that regulates the variable capacitor 202, instead of being dependent upon the number of capacitors 302 used in the charge pump circuit 300 of FIG. 3. In general, the efficiency of the circuit 200 and 202 is given by:

$$Eff = \frac{V_{out} - \Delta V}{V_{in} \cdot N}.$$

The voltage drop is assumed to be small, in this case 0.1 V.

Figure 5:
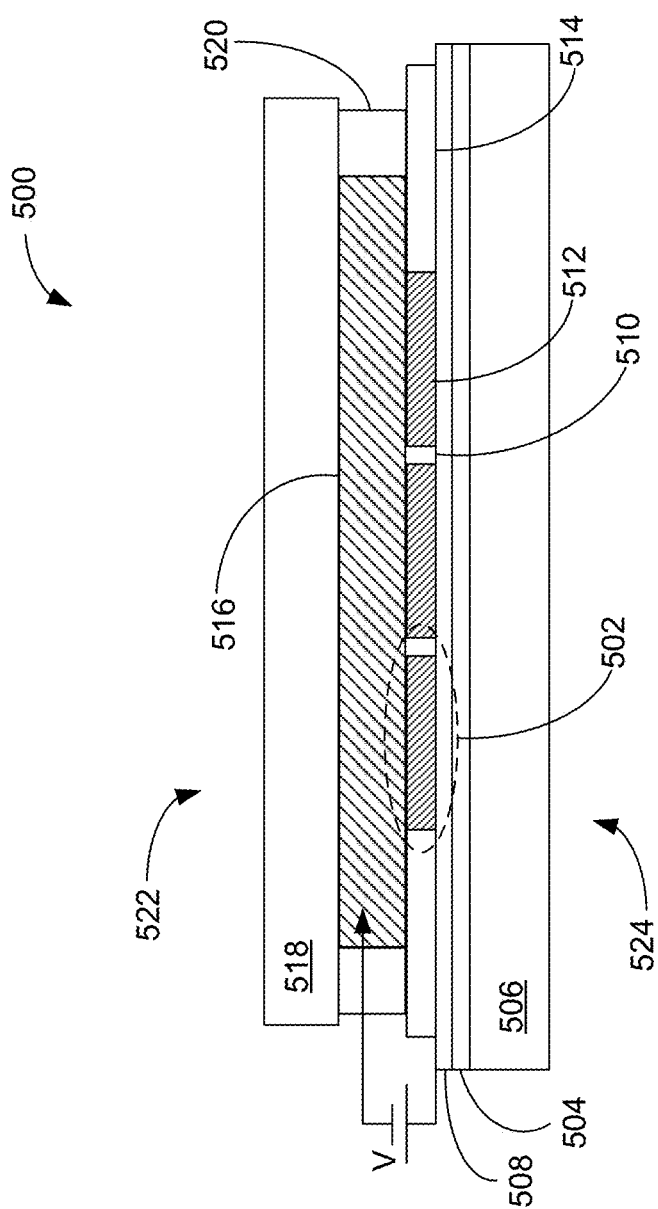
FIG. 5 is a cross-section of an example of a portion of an electrowetting display at least similar to the examples of electrowetting display illustrated in FIGS. 1A-1C, according to various embodiments.

Referring to FIG. 5, is a cross-section of a portion of an example of an electrowetting display 500 (similar to EWD 100 of FIGS. 1A-1C) that schematically illustrates several electrowetting elements 502 that generally correspond to pixel regions 116, according to some embodiments. An electrode layer 504 that includes the pixel electrodes 106 (not illustrated in FIG. 5) is formed on a bottom substrate or support plate 506. Generally, the electrode layer 504 comprises indium tin oxide (ITO). In some implementations, a dielectric barrier layer (not illustrated) may at least partially separate the electrode layer 504 from a hydrophobic layer 508 also formed on the bottom substrate 506 over the electrode layer 504. In some implementations, the hydrophobic layer 508 can comprise a fluoropolymer, such as, for example, AF1600, produced by DuPont, based in Wilmington, Del. Pixel walls 510 form a patterned electrowetting element grid on the hydrophobic layer 508, as can be seen in FIG. 5. The pixel walls 510 may comprise a photoresist material, such as, for example, epoxy-based negative photoresist SU-8. The patterned electrowetting element grid comprises rows and columns that form an electrowetting element array of field electrowetting elements and border electrowetting elements. For example, an electrowetting element can have a width and length in a range of about 50 to 500 microns. A first fluid 512, which can have a thickness in a range of about 1 to 10 microns, for example, overlies the hydrophobic layer 508. The first fluid 512 is generally an electrowetting oil and is partitioned by the pixel walls 510 of the patterned electrowetting element grid. An outer rim 514 can comprise the same material as the pixel walls 510. A second fluid 516, such as a fluid that includes an electrolyte and thus is an electroconductive or polar liquid, overlies the electrowetting oil 512 and the pixel walls 510 of the patterned electrowetting element grid.

A top substrate or support plate 518 covers the second fluid 516 and an adhesive/sealing material 520 serves as a seal and retains the second fluid 516 over the electrowetting element array. The adhesive/sealing material 520 generally comprises ultraviolet (UV) curable epoxy glue, although other types of adhesive/sealing material are acceptable. The bottom substrate 506 and the top substrate 518 may be separate parts of individual electrowetting elements or the bottom substrate 506 and the top substrate 518 may be shared by a plurality of electrowetting elements. The bottom substrate 506 and the top substrate 518 may be made of glass or polymer and may be rigid or flexible, for example.

A voltage V applied across the second fluid 516 and the dielectric barrier layer stack (e.g., the hydrophobic layer 508) of individual electrowetting elements can control transmittance or reflectance of the individual electrowetting elements 502.

The electrowetting display 500 has a viewing side 522 on which an image for display formed by the electrowetting display 500 can be viewed, and a rear side 524. The top substrate 518 faces viewing side 522 and the bottom substrate 506 faces the rear side 524. The top substrate 518 is coupled to the bottom substrate 506 with the adhesive/sealing material 520. In an alternative embodiment, the electrowetting display 500 may be viewed from the rear side 524. The electrowetting display 500 may be a reflective, transmissive or transreflective type. The electrowetting display 500 may be a segmented display type in which the image is built up of segments. The segments can be switched simultaneously or separately. Each segment includes one electrowetting element 502 or a number of electrowetting elements 502 that may be neighboring or distant from one another. The electrowetting elements 502 included in one segment are switched simultaneously, for example. The electrowetting display 500 may also be an active matrix driven display type or a passive matrix driven display, just to name a few examples.

The second fluid 516 is substantially immiscible with the first fluid 512. Generally, immiscible refers to the inability of the second fluid 516 to mix or blend with the first fluid 512. The second fluid 516 generally includes an electrolyte and is electrically conductive or polar. The second fluid 516 may be water or a salt solution such as a solution of potassium chloride in a mixture of water and ethyl alcohol, for example. The second fluid 516 may comprise at least one component selected from the group consisting of: ethylene glycol; diethyleneglycol; polyethylene glycol; propylene glycol; dioxalane; glyoxal; citric acid; oxalic acid; oxamic acid; and formic acid; and includes a second component which is different from the first component and is selected from the group consisting of: erythritol; ethylene glycol; ethylene carbonate; propylene carbonate; glycerol; and butanetriol.

The second fluid 516 is preferably transparent, but may be colored, white, absorbing or reflecting. The first fluid 512, generally referred to as electrowetting oil, is electrically non-conductive and may for instance be an alkane like hexadecane or (silicone) oil. The hydrophobic layer 508 is arranged on the bottom substrate 506 to create an electrowetting surface area. The hydrophobic character causes the first fluid 512 to adhere preferentially to the bottom substrate 506 since the first fluid 512 has a higher wettability with respect to the surface of the hydrophobic layer 508 than the hydrophobic layer 508 has with respect to the second fluid 516. Wettability relates to the relative affinity of a fluid for the surface of a solid. Wettability increases with increasing affinity, and it can be measured by the contact angle formed between the fluid and the solid and measured internal to the fluid of interest. For example, such a contact angle can increase from relative non-wettability of more than 90° to complete wettability at 0°, in which case the fluid tends to form a film on the surface of the solid.

The electrode layer 504 is separated from the first fluid 512 and the second fluid 516 by an insulator, which may be the hydrophobic layer 508. The electrode layer 504 (e.g., electrode 106 of FIGS. 1A-1C) is supplied with voltage signals V by a first signal line. A second signal line is electrically connected to a top electrode (not illustrated in FIG. 5; e.g., electrode 108 of FIGS. 1A-1C) that is in contact with the conductive second fluid 516. This top electrode may be common to more than one electrowetting element 502 since the electrowetting elements 502 are generally fluidly interconnected by and share the second fluid 516 uninterrupted by the pixel walls 510. The electrowetting elements 502 are controlled by the voltage V applied between the first and second signal lines.

The first fluid 512 absorbs at least a part of the optical spectrum. The first fluid 512 may be transmissive for a part of the optical spectrum, forming a color filter. For this purpose, the first fluid 512 may be colored by addition of pigment particles or dye, for example. Alternatively, the first fluid 512 may be black (e.g., absorbing substantially all parts of the optical spectrum) or reflecting. The hydrophobic layer 508 may be transparent or reflective. A reflective layer may reflect the entire visible spectrum, making the layer appear white, or part of it, making it have a color.

When the voltage V applied between the signal lines is set at a non-zero active signal level, the electrowetting element 502 will enter into an active state. Electrostatic forces will move the second fluid 516 toward the electrode layer 504, thereby repelling the first fluid 512 from the area of the hydrophobic layer 508 to the pixel walls 510 surrounding the area of the hydrophobic layer 508, to a droplet-like shape. This action uncovers the first fluid 512 from the surface of the hydrophobic layer 508 of the electrowetting element 502. When the voltage across the electrowetting element 502 is returned to an in-active signal level of zero volts or a value near to zero volts, the electrowetting element 502 will return to an inactive state, where the first fluid 512 flows back to cover the hydrophobic layer 508. In this way, the first fluid 512 forms an electrically controllable optical switch in each electrowetting element 502.

While embodiments of the present disclosure have been described primarily with respect to electrowetting displays, other types of displays can benefit from the present disclosure. For example, LCDs, electrophoretic displays, cholesteric LCDs, organic light emitting diode (OLED) displays, plasma panels, field emission displays, electrofluidic pixel displays, photonic ink displays, and other display technologies can benefit from the present disclosure and thus, the present disclosure is not limited to electrowetting displays.

Figure 6:
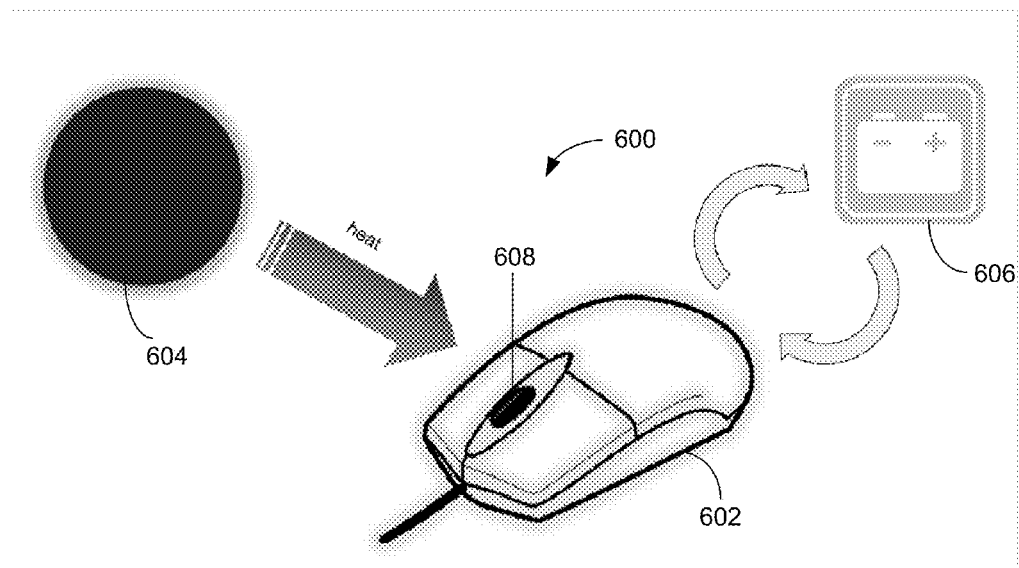
FIG. 6 schematically illustrates a computer mouse that includes pyroelectric material on a surface of the mouse, according to various embodiments.

Furthermore, other portable electronic devices that do not include a display may benefit from the present disclosure. For example, referring to FIG. 6, a computer mouse 600 is schematically illustrated and includes a pyroelectric material. The mouse 600 is coated with the pyroelectric material, e.g., polyvinylidene difluoride (PVDF), over a surface of a body 602 of the mouse 600 and the surface of the mouse 600 is connectable (within the mouse) to a power management integrated circuit (PMIC) (not illustrated). The power management integrated circuit generally includes a universal charge pump circuit similar to, for example, the charge pump circuits 200, 300 described herein. During use of the mouse 600, the outer surface of the mouse 600 absorbs heat from a heat source 604, e.g., a user's hand or non-tactile ambient heat source, that is supplied to the universal charge pump circuit that converts the heat to electricity (in the form of voltage). The universal charge pump circuit regulates the voltage level and charges a battery 606 of mouse 600. Another heat source can be generated by friction of a revolving scroll wheel 608 of the mouse 600. Between the components of the scrolling wheel 608 (which can be made out of metal), there is a pyroelectric material connectable to a PMIC (not illustrated) of the mouse 600 that includes a universal charge pump circuit. These are just two examples of harvesting heat for energy conversion during use of a computer mouse 600.

Figure 7:
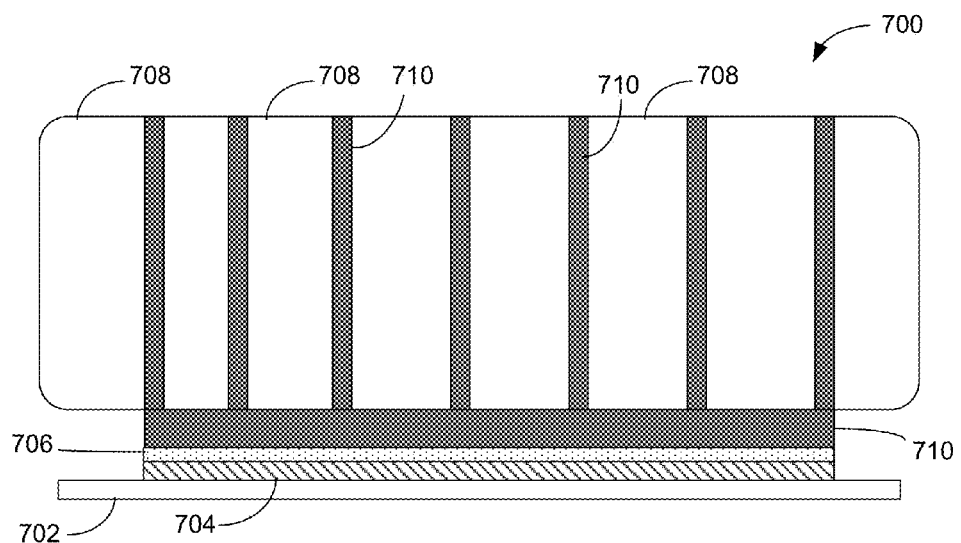
FIG. 7 schematically illustrates an example arrangement of a heat sink on a chip on a circuit board with pyroelectric material on the heat sink, according to various embodiments.

Referring to FIG. 7, another example of a use for a pyroelectric material within a portable electronic device includes computer chips, e.g., memory, processors and other heat-generating components. During operation such chips dissipate heat that can be recovered to power the portable electronic device or system in which they are integrated. For example, in portable electronic devices, a system-on-a-chip (SoC) or single board computer may not possess cooling systems. In such instances, the SoC generally relies on a heat sink to dissipate heat. FIG. 7 schematically illustrates an example arrangement 700 that includes a printed circuit board 702 and a chip 704 disposed thereon, e.g., a processor, a SoC, memory, etc. An adhesive 706 couples a heat sink 708 to the chip 702. A pyroelectric material 710, e.g., polyvinylidene difluoride (PVDF), is disposed on the heat sink 708. The heat sink 708 dissipates the heat received from the chip 704 and transfers the heat to the pyroelectric material 710. The pyroelectric material 710 is connected to a PMIC (not illustrated) that includes a universal charge pump circuit similar to, for example, the charge pump circuits 200, 300 described herein. The pyroelectric material 710 can be coupled to the PMIC via, for example, wiring. The universal charge pump circuit converts the heat to electricity (in the form of voltage). The universal charge pump circuit regulates the voltage level and can charge a power supply, e.g., a battery (not illustrated), thereby providing autonomy to the system and possibly making it portable.

Figure 8:
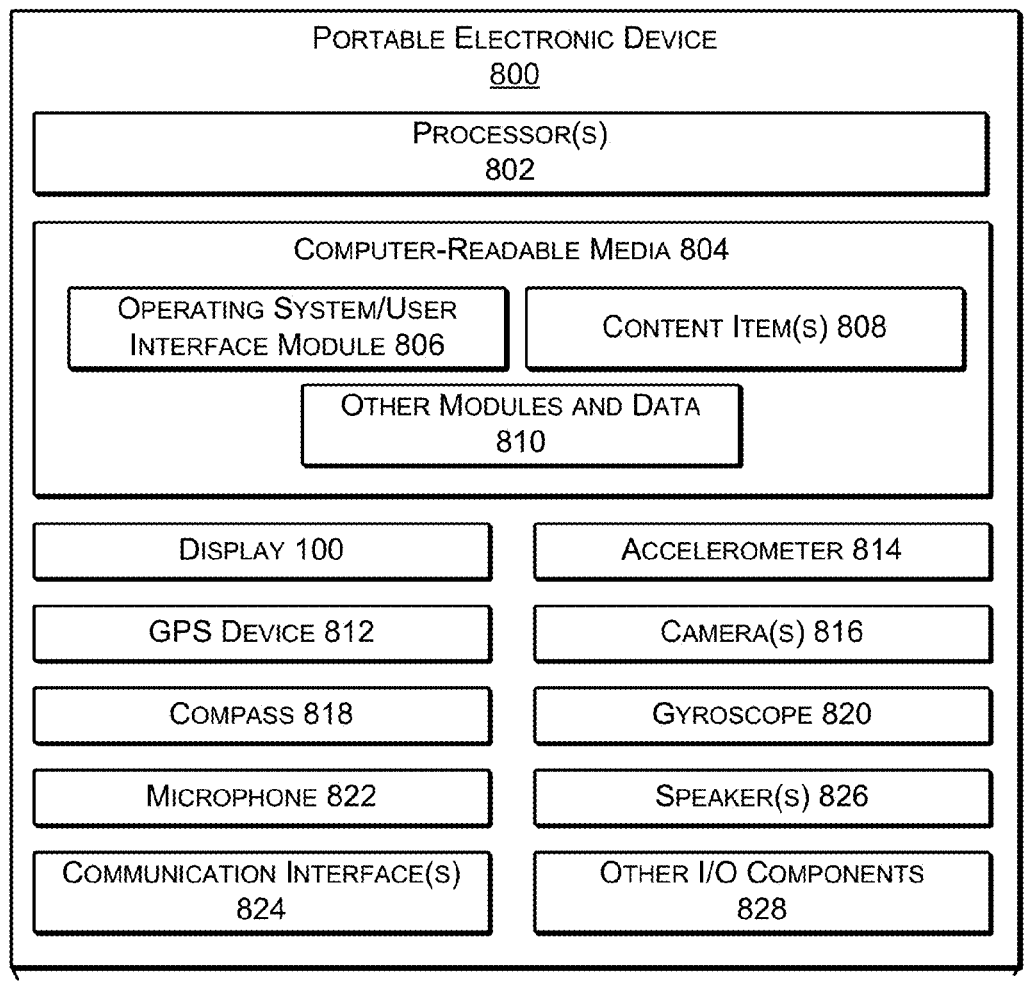
FIG. 8 illustrates select components of an example image display apparatus that may include an electrowetting display according to various embodiments described herein.
Figure 8:
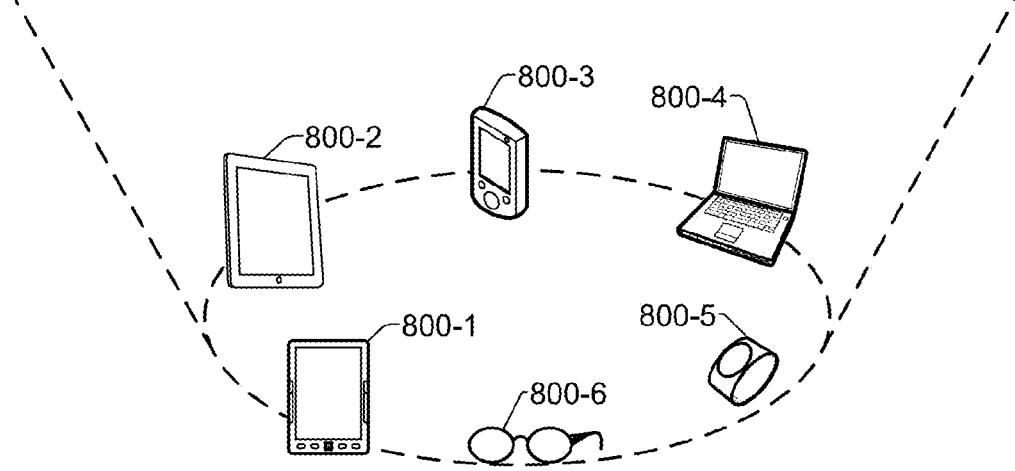

FIG. 8 illustrates select example components of an example image display apparatus 800 that may be used with the electrowetting display 100 according to some implementations. Other types of displays may also be used with the example image display apparatus 800. Such types of displays include, but are not limited to, LCDs, cholesteric displays, electrophoretic displays, electrofluidic pixel displays, photonic ink displays, and the like.

The image display apparatus 800 may be implemented as any of a number of different types of electronic devices. Some examples of the image display apparatus 800 may include digital media devices and eBook readers 800-1; tablet computing devices 800-2; smart phones, mobile devices and portable gaming systems 800-3; laptop and netbook computing devices 800-4; wearable computing devices 800-5; augmented reality devices, helmets, goggles or glasses 800-6; and any other device capable of connecting with the electrowetting display 100 and including a processor and memory for controlling the display according to the techniques described herein.

In a very basic configuration, the image display apparatus 800 includes, or accesses, components such as at least one control logic circuit, central processing unit, or processor 802, and one or more computer-readable media 804. Each processor 802 may itself comprise one or more processors or processing cores. For example, the processor 802 can be implemented as one or more microprocessors, microcomputers, microcontrollers, digital signal processors, central processing units, state machines, logic circuitries, and/or any devices that manipulate signals based on operational instructions. In some cases, the processor 802 may be one or more hardware processors and/or logic circuits of any suitable type specifically programmed or configured to execute the algorithms and processes described herein. The processor 802 can be configured to fetch and execute computer-readable instructions stored in the computer-readable media 804 or other computer-readable media. The processor 802 can also perform one or more functions attributed to a graphic controller (not illustrated) for the electrowetting display.

Depending on the configuration of the image display apparatus 800, the computer-readable media 804 may be an example of tangible non-transitory computer storage media and may include volatile and nonvolatile memory and/or removable and non-removable media implemented in any type of technology for storage of information such as computer-readable instructions, data structures, program modules or other data. The computer-readable media 804 may include, but is not limited to, RAM, ROM, EEPROM, flash memory or other computer-readable media technology, CD-ROM, digital versatile disks (DVD) or other optical storage, magnetic cassettes, magnetic tape, solid-state storage and/or magnetic disk storage. Further, in some cases, the image display apparatus 800 may access external storage, such as RAID storage systems, storage arrays, network attached storage, storage area networks, cloud storage, or any other medium that can be used to store information and that can be accessed by the processor 802 directly or through another computing device or network. Accordingly, the computer-readable media 804 may be computer storage media able to store instructions, modules or components that may be executed by the processor 802.

The computer-readable media 804 may be used to store and maintain any number of functional components that are executable by the processor 802. In some implementations, these functional components comprise instructions or programs that are executable by the processor 802 and that, when executed, implement operational logic for performing the actions attributed above to the image display apparatus 800. Functional components of the image display apparatus 800 stored in the computer-readable media 804 may include the operating system and user interface module 806 for controlling and managing various functions of the image display apparatus 800, and for generating one or more user interfaces on the electrowetting display 100 of the image display apparatus 800.

In addition, the computer-readable media 804 may also store data, data structures and the like, that are used by the functional components. For example, data stored by the computer-readable media 804 may include user information and, optionally, one or more content items 808. Depending on the type of the image display apparatus 800, the computer-readable media 804 may also optionally include other functional components and data, such as other modules and data 810, which may include programs, drivers and so forth, and the data used by the functional components. Further, the image display apparatus 800 may include many other logical, programmatic and physical components, of which those described are merely examples that are related to the discussion herein. Further, while the figures illustrate the functional components and data of the image display apparatus 800 as being present on the image display apparatus 800 and executed by the processor 802 on the image display apparatus 800, it is to be appreciated that these components and/or data may be distributed across different computing devices and locations in any manner.

FIG. 8 further illustrates examples of other components that may be included in the image display apparatus 800. Such examples include various types of sensors, which may include a GPS device 812, an accelerometer 814, one or more cameras 816, a compass 818, a gyroscope 820, a microphone 822, and so forth.

The image display apparatus 800 may further include one or more communication interfaces 824, which may support both wired and wireless connection to various networks, such as cellular networks, radio, Wi-Fi networks, close-range wireless connections, near-field connections, infrared signals, local area networks, wide area networks, the Internet, and so forth. The communication interfaces 824 may further allow a user to access storage on or through another device, such as a remote computing device, a network attached storage device, cloud storage, or the like.

The image display apparatus 800 may further be equipped with one or more speakers 826 and various other input/output (I/O) components 828. Such I/O components 828 may include a touchscreen and various user controls (e.g., buttons, a joystick, a keyboard, a keypad, etc.), a haptic or tactile output device, connection ports, physical condition sensors, and so forth. For example, the operating system 806 of the image display apparatus 800 may include suitable drivers configured to accept input from a keypad, keyboard, or other user controls and devices included as the I/O components 828. Additionally, the image display apparatus 800 may include various other components that are not illustrated, examples of which include removable storage, a power source, such as a battery and power control unit, a PC Card component, and so forth.

Various instructions, methods and techniques described herein may be considered in the general context of computer-executable instructions, such as program modules stored on computer storage media and executed by the processors herein. Generally, program modules include routines, programs, objects, components, data structures, etc., for performing particular tasks or implementing particular abstract data types. These program modules, and the like, may be executed as native code or may be downloaded and executed, such as in a virtual machine or other just-in-time compilation execution environment. Typically, the functionality of the program modules may be combined or distributed as desired in various implementations. An implementation of these modules and techniques may be stored on computer storage media or transmitted across some form of communication.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications can be made, and equivalents can be substituted, without departing from claimed subject matter. Additionally, many modifications can be made to adapt a particular situation to the teachings of claimed subject matter without departing from the central concept described herein. Therefore, it is intended that claimed subject matter not be limited to the particular embodiments disclosed, but that such claimed subject matter can also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter can be practiced without these specific details. In other instances, methods, devices, or systems that would be known by one of ordinary skill have not been described in detail so as not to obscure claimed subject matter.

Reference throughout this specification to "one embodiment" or "an embodiment" can mean that a particular feature, structure, or characteristic described in connection with a particular embodiment can be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described can be combined in various ways in one or more embodiments. In general, of course, these and other issues can vary with the particular context of usage. Therefore, the particular context of the description or the usage of these terms can provide helpful guidance regarding inferences to be drawn for that context.

What is claimed is:

1. An electrowetting display comprising:
    a first substrate and a second substrate opposite to the first substrate;
    a plurality of pixel walls that intersect to define a plurality of pixel areas;
    a first electrode on the first substrate and a second electrode on the second substrate;
    a hydrophobic surface on the first electrode;
    an electrowetting oil within the pixel areas and on the hydrophobic surface between the first substrate and the second substrate;
    a fluid that includes an electrolyte, wherein the fluid is disposed on the electrowetting oil, wherein the first and second electrodes apply an electric field in the plurality of pixel areas, wherein the electric field causes the fluid to move onto the hydrophobic surface to displace a portion of the electrowetting oil on the hydrophobic surface; and
    a pyroelectric layer disposed between the first substrate and the second substrate, wherein the pyroelectric layer is configured to absorb thermal energy from within the electrowetting display and output a voltage, and wherein the pyroelectric layer is coupled to a charge pump that receives the voltage from the pyroelectric layer.

2. The electrowetting display of claim 1, wherein the pyroelectric layer is disposed directly on the second substrate and is coupled to the charge pump via one of (i) through-silicon vias or (ii) wirebond connections.

3. The electrowetting display of claim 1, wherein the pyroelectric layer is disposed on the first substrate and is coupled to the charge pump via wirebond connections.

4. The electrowetting display of claim 3, wherein the pyroelectric layer comprises of polyvinylidene difluoride and the hydrophobic surface comprises a surface of the pyroelectric layer.

5. The electrowetting display of claim 3, wherein the pyroelectric layer is a first pyroelectric layer and the electrowetting display comprises a second pyroelectric layer disposed directly on the second substrate, and wherein the second pyroelectric layer is coupled to the charge pump via wirebond connections.

6. An electronic device comprising an electrowetting display, the electrowetting display comprising:
   a first substrate and a second substrate opposite to the first substrate;
   a plurality of pixel portions defined between the first substrate and the second substrate;
   a hydrophobic surface on the first substrate;
   a first fluid within the pixel portions and on the hydrophobic surface;
   a second fluid on the first fluid, wherein the second fluid is substantially immiscible with the first fluid; and
   a pyroelectric layer disposed between the first substrate and the second substrate, wherein the pyroelectric layer is configured to absorb thermal energy and output a voltage.

7. The electronic device of claim 6, wherein the pyroelectric layer comprises polyvinylidene difluoride.

8. The electronic device of claim 6, wherein the pyroelectric layer is disposed on the second substrate and is coupled to a charge pump circuit via one of (i) through-silicon vias or (ii) wirebond connections.

9. The electronic device of claim 6, wherein the pyroelectric layer is disposed on the first substrate and is coupled to a charge pump circuit via wirebond connections.

10. The electronic device of claim 9, wherein the hydrophobic surface comprises the pyroelectric layer.

11. The electronic device of claim 9, wherein the pyroelectric layer is a first pyroelectric layer disposed on the first substrate and the electrowetting display device comprises a second pyroelectric layer disposed on the second substrate, and wherein the second pyroelectric layer is coupled to the charge pump circuit via wirebond connections.

12. The electronic device of claim 6, further comprising;
   a battery; and
   a power management module coupled to the battery, wherein the power management module comprises a charge pump circuit coupled to the pyroelectric layer, and wherein the charge pump circuit is configured to receive the voltage from the pyroelectric layer and charge the battery.

13. The electronic device of claim 12, wherein the charge pump circuit comprises:
   an input port coupled to the pyroelectric layer;
   a variable first capacitor connected in parallel with the input port and coupled to the input port via a first switch; and
   a second capacitor connected in parallel with the variable first capacitor and coupled to the variable first capacitor via a second switch, wherein the battery is connected in parallel to the second capacitor.

14. The electronic device of claim 12, wherein the charge pump circuit further comprises:
   a voltage input coupled to the pyroelectric layer;
   a plurality of capacitors arranged in series, wherein each capacitor is coupled to an adjacent capacitor via one of a plurality first switches, and wherein the plurality of capacitors is arranged in parallel with the voltage input and coupled to the voltage input via a second switch;
   a buffer capacitor arranged in parallel with the plurality of capacitors and coupled to the plurality of capacitors via a plurality of third switches; and
   a voltage output arranged in parallel with the buffer capacitor and coupled to the buffer capacitor and to the battery.

15. A display comprising:
   a first substrate and a second substrate facing the first substrate;
   a plurality of pixel portions defined between the first substrate and the second substrate;
   a first pyroelectric layer disposed on the first substrate and coupled to a charge pump circuit, wherein the first pyroelectric layer is configured to absorb thermal energy and output a voltage; and
   a second pyroelectric layer disposed on the second substrate, wherein the second pyroelectric layer is coupled to the charge pump circuit.

16. The display of claim 15, wherein the first pyroelectric layer comprises polyvinylidene difluoride.

17. The display of claim 15, wherein the first pyroelectric layer is coupled to the charge pump circuit via one of (i) through-silicon vias or (ii) wirebond connections.

18. A display comprising:
   a first substrate and a second substrate opposite to the first substrate;
   a first pyroelectric layer disposed on the first substrate between the first substrate and the second substrate, wherein the first pyroelectric layer is configured to absorb thermal energy and output a voltage;
   a charge pump circuit coupled to the first pyroelectric layer; and
   a second pyroelectric layer disposed on the second substrate and coupled to the charge pump circuit.

19. The display of claim 18, wherein the charge pump circuit comprises a DC to DC power converter.

20. The display of claim 18, wherein the charge pump circuit is integrated into a printed circuit board (PCB) underneath the first substrate or the second substrate.

* * * * *